US012641739B2

(12) United States Patent
Jung et al.

(10) Patent No.: US 12,641,739 B2
(45) Date of Patent: May 26, 2026

(54) PATTERNED ELECTRONIC DEVICE AND HOUSING

(71) Applicant: SAMSUNG ELECTRONICS CO., LTD., Suwon-si (KR)

(72) Inventors: Poonggi Jung, Suwon-si (KR); Seonjung Kim, Suwon-si (KR); Kyunghyun Kim, Suwon-si (KR); Hakju Kim, Suwon-si (KR); Hyunsuk Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 187 days.

(21) Appl. No.: 18/240,136

(22) Filed: Aug. 30, 2023

(65) Prior Publication Data

US 2024/0074076 A1 Feb. 29, 2024

Related U.S. Application Data

(63) Continuation of application No. PCT/KR2023/012920, filed on Aug. 30, 2023.

(30) Foreign Application Priority Data

Aug. 30, 2022 (KR) ........................ 10-2022-0109381
Nov. 7, 2022 (KR) ........................ 10-2022-0147290

(51) Int. Cl.
*H05K 5/02* (2006.01)

(52) U.S. Cl.
CPC ................................ *H05K 5/0243* (2013.01)

(58) Field of Classification Search
CPC .................................................... H05K 5/0243
See application file for complete search history.

(56) References Cited

U.S. PATENT DOCUMENTS

| | | | |
|---|---|---|---|
| 5,250,173 A | 10/1993 | Jozefowicz | |
| 10,737,465 B2 | 8/2020 | Shin | |
| 2012/0135512 A1 | 5/2012 | Vasylyev | |
| 2013/0248219 A1 | 9/2013 | Browning et al. | |
| 2018/0056690 A1 | 3/2018 | Bollström et al. | |
| 2018/0361630 A1* | 12/2018 | Kim | ................... B29C 35/0805 |
| 2023/0030545 A1* | 2/2023 | Kim | ................... H04M 1/0283 |

FOREIGN PATENT DOCUMENTS

| | | |
|---|---|---|
| CN | 206023857 U | 3/2017 |
| JP | 2010-179518 A | 8/2010 |
| JP | 2011-5682 A | 1/2011 |

(Continued)

OTHER PUBLICATIONS

KR 20180129039 A Machine Translation (Year: 2018).*

(Continued)

*Primary Examiner* — Travis M Figg
(74) *Attorney, Agent, or Firm* — Sughrue Mion, PLLC

(57) ABSTRACT

A housing of an electronic device includes a base layer, a first visible layer provided on a first surface of the base layer, and a second visible layer provided on a second surface of the base layer. The second visible layer is non-visible from an outside of the electronic device in a first illumination environment and where the first visible layer and the second visible layer are visible from the outside of the electronic device in a second illumination environment.

20 Claims, 12 Drawing Sheets

(56)                References Cited

FOREIGN PATENT DOCUMENTS

| KR | 10-2015-0102553 | A | | 9/2015 | | |
| KR | 10-2017-0125894 | A | | 11/2017 | | |
| KR | 10-1832956 | B1 | | 2/2018 | | |
| KR | 10-2018-0129039 | A | | 12/2018 | | |
| KR | 20180129039 | A | * | 12/2018 | ............ | B32B 17/10 |
| KR | 10-2019-0001281 | A | | 1/2019 | | |
| KR | 10-2021-0045292 | A | | 4/2021 | | |
| KR | 10-2022-0032827 | A | | 3/2022 | | |
| KR | 10-2423822 | B1 | | 7/2022 | | |
| WO | 2020/070589 | A1 | | 4/2020 | | |

OTHER PUBLICATIONS

International Search Report (PCT/ISA/210) issued on Nov. 28, 2023 by the International Searching Authority in International Patent Application No. PCT/KR2023/012920.

Written Opinion (PCT/ISA/237) issued on Nov. 28, 2023 by the International Searching Authority in International Patent Application No. PCT/KR2023/012920.

Communication issued Jul. 15, 2025 by the European Patent Office in European Patent Application No. 23860889.7.

* cited by examiner

PATTERNED ELECTRONIC DEVICE AND HOUSING

CROSS-REFERENCE TO RELATED APPLICATIONS

This application is a continuation of International Application No. PCT/KR2023/012920, filed on Aug. 30, 2023, in the Korean Intellectual Property Receiving Office, which is based on and claims priority to Korean Patent Application No. 10-2022-0147290, filed on Nov. 7, 2022, in the Korean Intellectual Property Office, and Korean Patent Application No. 10-2022-0109381, filed on Aug. 30, 2022, in the Korean Intellectual Property Office, and the disclosures of which are incorporated by reference herein in their entireties.

BACKGROUND

1. Field

The disclosure relates to a patterned electronic device and a housing structure of the electronic device.

2. Description of Related Art

Due to the development of the information technology, communication technology and semiconductor technology, the use of various electronic devices is increased. Further, electronic devices may output stored information as voices or images. As electronic devices are highly integrated, and high-speed or high-volume wireless communication becomes commonplace, an electronic device, such as a mobile communication terminal, may be configured to perform various functions, such as integrated functionality, including an entertainment function (e.g., video games), a multimedia function (e.g., replaying music/videos), a communication and security function (e.g., for mobile banking), a scheduling function, an e-wallet function, etc. These electronic devices have been downsized to be conveniently carried by users.

There is an ongoing research effort to provide a better aesthetic appearance to the electronic device by using various patterns in manufacturing the housing which forms the exterior.

However, despite such a combination of various effects and various colors, there exist limitations in representing visual effects differently depending on specific environments.

SUMMARY

Provided are an electronic device that may implement the effect of allowing the housing pattern to be partially visible or hidden (hidden effect) depending on the use environment of the electronic device and/or an external environment.

Additional aspects will be set forth in part in the description which follows and, in part, will be apparent from the description, or may be learned by practice of the presented embodiments.

According to an aspect of the disclosure, a housing of an electronic device may include a base layer, a first visible layer provided on a first surface of the base layer, and a second visible layer provided on a second surface of the base layer. wherein the second visible layer may be non-visible from an outside of the electronic device in a first illumination environment and where the first visible layer and the second visible layer may be visible from the outside of the electronic device in a second illumination environment.

The first illumination environment may have an illumination value of about 600 lux or less and the second illumination environment may have an illumination value greater than about 600 lux.

The first visible layer may include a first pattern layer having a first pattern and a first color layer having a first color.

The first pattern of the first pattern layer may be a lenticular pattern.

The lenticular pattern may have a height of 7 $\mu$m to 12 $\mu$m.

The lenticular pattern may have a pitch of 60 $\mu$m to 90 $\mu$m.

The first color layer may have a reflectance of 40% to 50%.

The first color layer may include a combination of $TiO_2$ and $SiO_2$.

The first color layer may include a combination of a plurality of colors.

The second visible layer may include a second pattern layer having a second pattern and a second color layer having a second color.

The second color layer may have a reflectance of 30% to 45%.

The housing may include an adhesive layer provided on a surface of the first visible layer and glass provided on the adhesive layer.

The housing may include at least one third visible layer different from the first visible layer and the second visible layer.

The at least one third visible layer may be provided on a surface of the second visible layer.

The at least one third visible layer may be non-visible from the outside of the electronic device in the first illumination environment and the second illumination environment and the at least one third visible layer may be visible from the outside of the electronic device in a third illumination environment.

According to an aspect of the disclosure, a housing of an electronic device may include a base layer, a first pattern layer provided on a first surface of the base layer, a first color layer provided on a surface of the first pattern layer, a second pattern layer provided on a second surface of the base layer, and a second color layer provided on a surface of the second pattern layer. wherein the first pattern layer may have a lenticular pattern, the second pattern layer have include a macro pattern, the second color layer may be non-visible from an outside of the electronic device in a first illumination environment and the first color layer and the second color layer may be visible from the outside of the electronic device in a second illumination environment.

The first illumination environment may have an illumination value of about 600 lux or less and the second illumination environment may have an illumination value greater than about 600 lux.

The housing may include at least one third visible layer provided on a surface of the second color layer, and different from the first color layer and the second color layer.

According to an aspect of the disclosure, a film of an electronic device may include a base layer, a first visible layer provided on a first surface of the base layer, and a second visible layer provided on a second surface of the base layer. wherein the first visible layer may be configured such that the second visible layer is non-visible from an outside of the electronic device in a first illumination environment and such that the second visible layer is visible from the outside of the electronic device in a second illumination environment.

The first illumination environment may have an illumination value of about 600 lux or less and the second illumination environment may have an illumination value greater than about 600 lux.

BRIEF DESCRIPTION OF DRAWINGS

The above and other aspects, features, and advantages of certain embodiments of the present disclosure will be more apparent from the following description taken in conjunction with the accompanying drawings, in which.

DETAILED DESCRIPTION

Figure 1:
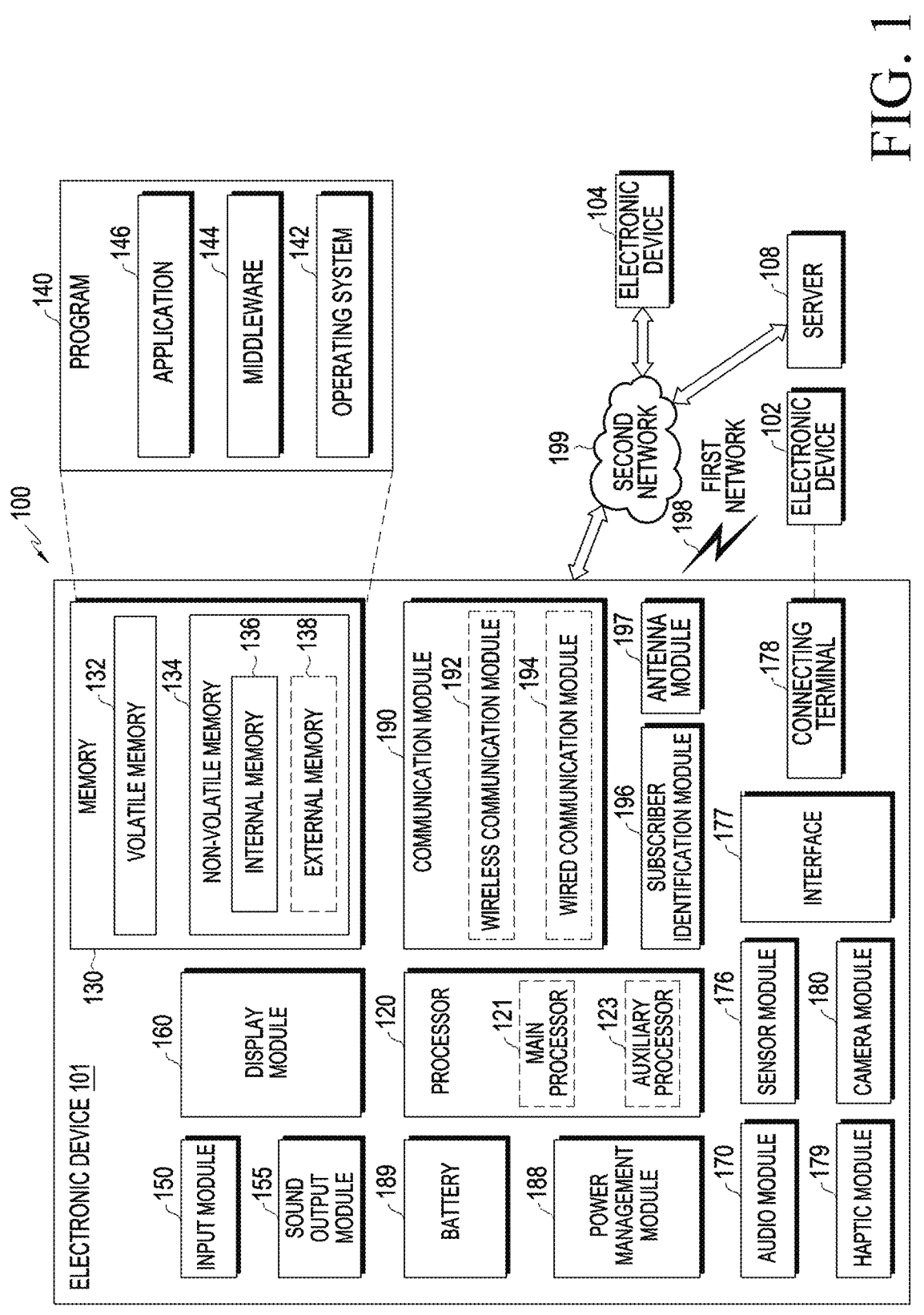
FIG. 1 is a diagram illustrating an electronic device in a network environment according to an embodiment.

Hereinafter, example embodiments of the disclosure will be described in detail with reference to the accompanying drawings. The same reference numerals are used for the same components in the drawings, and redundant descriptions thereof will be omitted. The embodiments described herein are example embodiments, and thus, the disclosure is not limited thereto and may be realized in various other forms. It is to be understood that singular forms include plural referents unless the context clearly dictates otherwise. The terms including technical or scientific terms used in the disclosure may have the same meanings as generally understood by those skilled in the art.

FIG. 1 is a diagram illustrating an electronic device 101 in a network environment 100 according to various embodiments.

Referring to FIG. 1, the electronic device 101 in the network environment 100 may communicate with at least one of an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In an embodiment, at least one (e.g., the connecting terminal 178) of the components may be omitted from the electronic device 101, or one or more other components may be added in the electronic device 101. According to an embodiment, some (e.g., the sensor module 176, the camera module 180, or the antenna module 197) of the components may be integrated into a single component (e.g., the display module 160). The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be configured to use lower power than the main processor 121 or to be specified for a designated function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. The artificial intelligence model may be generated via machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by other component (e.g., the processor 120) of the electronic device 101, from the outside (e.g., a user) of the electronic device 101. The input module 150 may include, for example, a microphone, a mouse, a keyboard, keys (e.g., buttons), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor configured to detect a touch, or a pressure sensor configured to measure the intensity of a force generated by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an accelerometer, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the AP) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via a first network 198 (e.g., a short-range communication network, such as Bluetooth™, wireless-fidelity (Wi-Fi) direct, or infrared data association (IrDA)) or a second network 199 (e.g., a long-range communication network, such as a legacy cellular network, a 5G network, a next-generation communication network, the Internet, or a computer network (e.g., local area network (LAN) or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device). According to an embodiment, the antenna module may include an antenna including a radiator formed of a conductor or conductive pattern formed on a substrate (e.g., a printed circuit board (PCB)). According to an embodiment, the antenna module 197 may include a plurality of antennas (e.g., an antenna array). In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment, other parts (e.g., radio frequency integrated circuit (RFIC)) than the radiator may be further formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. The external electronic devices 102 or 104 each may be a device of the same or a different type from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra-low-latency services using, e.g., distributed computing or mobile edge computing. In another embodiment, the external electronic device 104 may include an Internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or health-care) based on 5G communication technology or IoT-related technology.

Figure 2:
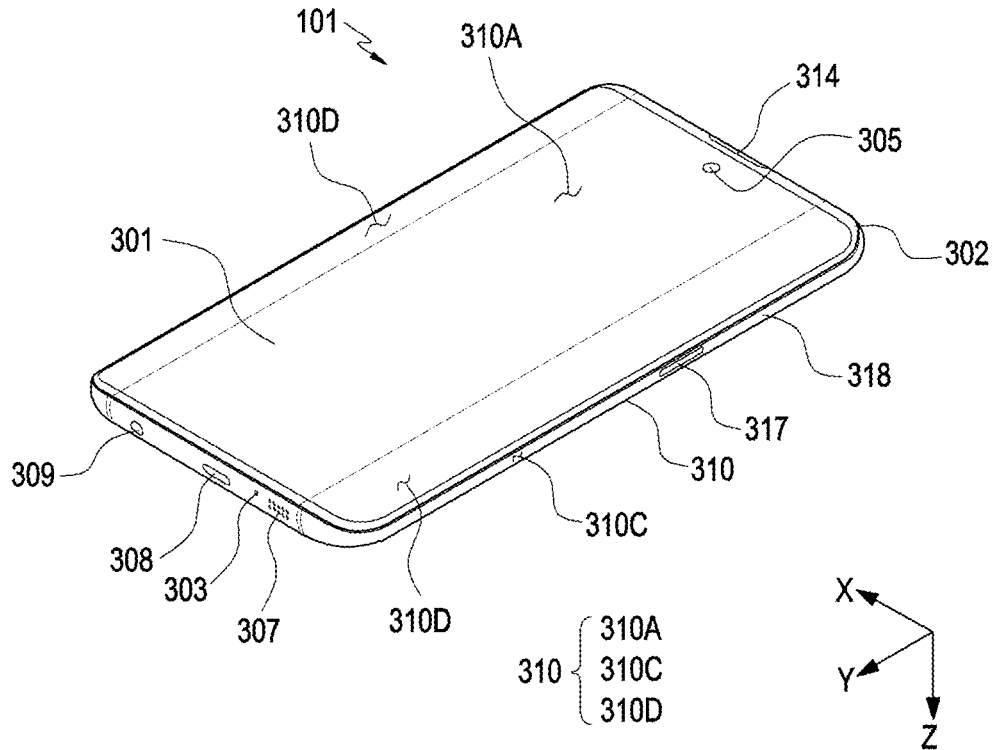
FIG. 2 is a front view illustrating an electronic device according to an embodiment of the disclosure.
Figure 3:
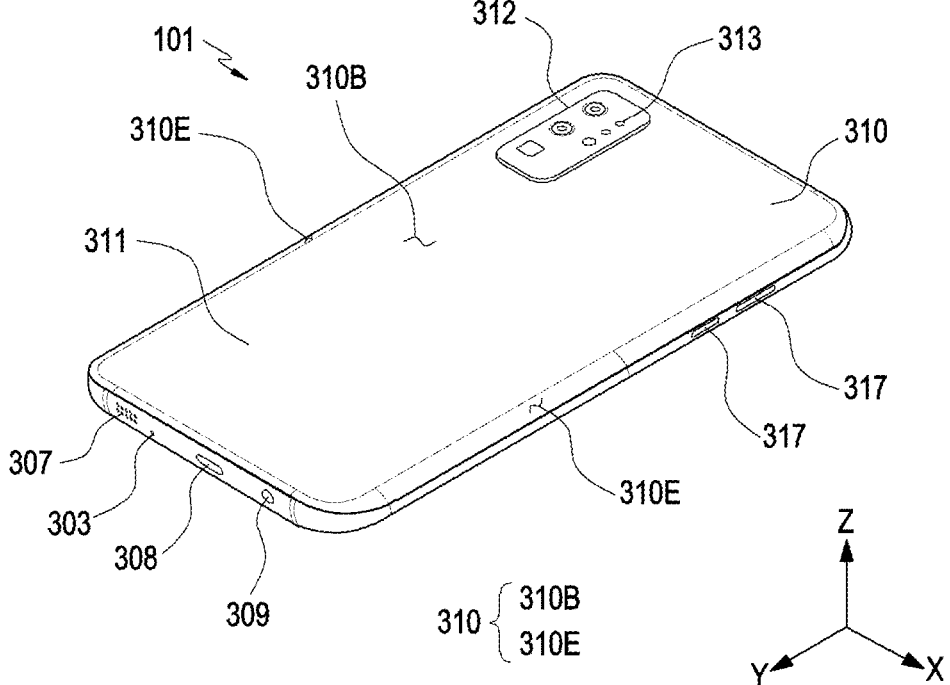
FIG. 3 is a rear view illustrating an electronic device according to an embodiment of the disclosure.

FIG. 2 is a front view illustrating an electronic device according to various embodiments of the disclosure. FIG. 3 is a rear view illustrating an electronic device according to various embodiments of the disclosure.

Referring to FIGS. 2 and 3, according to an embodiment, an electronic device 101 may include a housing 310 with a front surface 310A, a rear surface 310B, and a side surface 310C surrounding a space between the front surface 310A and the rear surface 310B. According to another embodiment, the housing 310 may denote a structure forming part of the front surface 310A, the rear surface 310B, and the side surface 310C of FIG. 2. According to an embodiment, at least part of the front surface 310A may have a substantially transparent front plate 302 (e.g., a glass plate or polymer plate including various coating layers). The rear surface 310B may be formed by a rear plate 311. The rear plate 311 may be formed of, e.g., glass, ceramic, polymer, metal (e.g., aluminum, stainless steel (STS), or magnesium), or a combination of at least two thereof. The side surface 310C may be formed by a side bezel structure (or a "side member") 318 that couples to the front plate 302 and the rear plate 311 and includes a metal and/or polymer. According to an embodiment, the rear plate 311 and the side bezel structure 318 may be integrally formed together and include the same material (e.g., glass, metal, such as aluminum, or ceramic).

In the embodiment illustrated, the front plate 302 may include two first edge areas 310D, which seamlessly and bendingly extend from the front surface 310A to the rear plate 311, on both the long edges of the front plate 302. In the embodiment (refer to FIG. 3) illustrated, the rear plate 311 may include two second edge areas 310E, which seamlessly and bendingly extend from the rear surface 310B to the front plate, on both the long edges. According to an embodiment, the front plate 302 (or the rear plate 311) may include only one of the first edge areas 310D (or the second edge areas 310E). Alternatively, the first edge areas 310D or the second edge areas 301E may partially be excluded. According to an embodiment, at side view of the electronic device 101, the side bezel structure 318 may have a first thickness (or width) for sides that do not have the first edge areas 310D or the second edge areas 310E and a second thickness, which is smaller than the first thickness, for sides that have the first edge areas 310D or the second edge areas 310E.

According to an embodiment, the electronic device 101 may include at least one of a display 301, audio modules 303, 307, and 314 (e.g., the audio module 170 of FIG. 1), a sensor module (e.g., the sensor module 176 of FIG. 1), camera modules 305, 312, and 313 (e.g., the camera module 180 of FIG. 1), a key input device 317 (e.g., the input module 150 of FIG. 1), and connector holes 308 and 309 (e.g., the connecting terminal 178 of FIG. 1). According to an embodiment, the electronic device 101 may exclude at least one (e.g., the connector hole 309) of the components or may add other components.

According to an embodiment, the display 301 may be visually revealed through, e.g., a majority portion of the front plate 302. According to an embodiment, at least a portion of the display 301 may be exposed through the front plate 302 forming the front surface 310A and the first edge areas 310D. According to an embodiment, the edge of the display 301 may be formed to be substantially the same in shape as an adjacent outer edge of the front plate 302. According to another embodiment, the interval between the outer edge of the display 301 and the outer edge of the front plate 302 may remain substantially even to give a larger area of exposure the display 301.

According to an embodiment, the surface (or the front plate 302) of the housing 310 may include a screen display area formed as the display 301 is visually exposed. For example, the screen display area may include the front surface 310A and first edge areas 310D.

According to another embodiment, a recess or opening may be formed in a portion of the screen display region (e.g., the front surface 310A or the first edge area 310D) of the display 301, and at least one or more of the audio module 314, sensor module, light emitting device, and camera module 305 may be aligned with the recess or opening. According to another embodiment, at least one or more of the audio module 314, sensor module, camera module 305, fingerprint sensor, and light emitting device may be included on the rear surface of the screen display area of the display 301.

According to an embodiment, the display 301 may be disposed to be coupled with, or adjacent, a touch detecting circuit, a pressure sensor capable of measuring the strength (pressure) of touches, and/or a digitizer for detecting a magnetic field-type stylus pen.

According to an embodiment, at least part of the key input device 317 may be disposed in the first edge areas 310D and/or the second edge areas 310E.

According to an embodiment, the audio modules 303, 307, and 314 may include, e.g., a microphone hole 303 and speaker holes 307 and 314. The microphone hole 303 may have a microphone inside to obtain external sounds. According to an embodiment, there may be a plurality of microphones to be able to detect the direction of a sound. The speaker holes 307 and 314 may include an external speaker hole 307 and a phone receiver hole 314. In some embodiments, the speaker holes 307 and 314 and the microphone hole 303 may be implemented as a single hole, or a speaker may be included without the speaker holes 307 and 314 (e.g., a piezo speaker). The audio modules 303, 307, and 314 are not limited to the above-described structure. Depending on the structure of the electronic device 101, various design changes may be made (e.g., only some of the audio modules may be mounted, or a new audio module may be added).

According to an embodiment, the sensor modules may generate an electrical signal or data value corresponding to an internal operating state or external environmental state of the electronic device 101. The sensor modules may include a first sensor module (e.g., a proximity sensor) and/or a second sensor module (e.g., a fingerprint sensor) disposed on the front surface 310A of the housing 310 and/or a third sensor module (e.g., a heart rate monitor (HRM) sensor) and/or a fourth sensor module (e.g., a fingerprint sensor) disposed on the rear surface 310B of the housing 310. In an embodiment, the fingerprint sensor may be disposed on the rear surface 310B as well as on the front surface 310A (e.g., the display 301) of the housing 310. The electronic device 101 may further include sensor modules, such as at least one of a gesture sensor, a gyro sensor, an atmospheric pressure sensor, a magnetic sensor, an acceleration sensor, a grip sensor, a color sensor, an IR sensor, a biometric sensor, a temperature sensor, a humidity sensor, or an illuminance sensor. The sensor module is not limited to the above-described structure. Depending on the structure of the electronic device 101, various design changes may be made (e.g., only some of the sensor modules may be mounted, or a new sensor module may be added).

According to an embodiment, the camera modules 305, 312, and 313 may include a first camera module 305 disposed on the front surface 310A of the electronic device 101, and a rear camera device 312 and/or a flash 313 disposed on the rear surface 310B. The camera modules 305 and 312 may include one or more lenses, an image sensor, and/or an image signal processor. The flash 313 may include, e.g., a light emitting diode (LED) or a xenon lamp. According to an embodiment, two or more lenses (an IR camera, a wide-angle lens, and a telephoto lens) and image sensors may be disposed on one surface of the electronic device 101. The camera modules 305, 312, and 313 are not limited to the above-described structure. Depending on the structure of the electronic device 101, various design changes may be made (e.g., only some of the camera modules may be mounted, or a new camera module may be added).

According to an embodiment, the electronic device 101 may include a plurality of camera modules (e.g., a dual camera or triple camera) having different attributes (e.g., angle of view) or functions. For example, a plurality of camera modules 305 and 312 including lenses having different angles of view may be configured, and the electronic device 101 may control to change the angle of view of the camera modules 305 and 312 performed by the electronic device 101 based on the user's selection. At least one of the plurality of camera modules 305 and 312 may form, for example, a wide-angle camera and at least another of the plurality of camera modules may form a telephoto camera. Similarly, at least one of the plurality of camera modules 305 and 312 may be a front camera and at least another of the plurality of camera modules may be a rear camera. Further, the plurality of camera modules 305 and 312 may include at least one of a wide-angle camera, a telephoto camera, and an IR camera (e.g., a time of flight (TOF) camera, a structured light camera). According to an embodiment, the IR camera may be operated as at least a portion of the sensor module. For example, the TOF camera may be operated as at least a portion of a sensor module for detecting the distance to the subject.

According to an embodiment, the key input device 317 may be disposed on the side surface 310C of the housing 310. According to an embodiment, the electronic device 101 may exclude all or some of the above-mentioned key input devices 317 and the excluded key input devices 317 may be implemented in other forms (e.g., as soft keys) on the display 301. According to an embodiment, the key input device may include the sensor module disposed on the rear surface 310B of the housing 310.

According to an embodiment, the light emitting device may be disposed on, e.g., the front surface 310A of the housing 310. The light emitting device may provide, e.g., information about the state of the electronic device 101 in the form of light. According to another embodiment, the light emitting device may provide a light source that interacts with, e.g., the front camera module 305. The light emitting device may include, e.g., an LED, an IR LED, and/or a xenon lamp.

According to an embodiment, the connector holes 308 and 309 may include, e.g., a first connector hole 308 for receiving a connector (e.g., a USB connector) for transmitting or receiving power and/or data to/from an external electronic device and/or a second connector hole (e.g., an earphone jack) 309 for receiving a connector for transmitting or receiving audio signals to/from the external electronic device. The connector holes 308 and 309 are not limited to the above-described structure. Depending on the structure of the electronic device 101, various design changes may be made, such as mounting only some of the connector holes or adding a new connector hole.

According to an embodiment, the camera module 305 and/or the sensor module may be disposed to contact the external environment through a designated area of the display 301 and the front plate 302 from the internal space of the electronic device 101. For example, the designated area may be an area in which pixels are not disposed in the display 301. As another example, the designated area may be an area in which pixels are disposed in the display 301. When viewed from above the display 301, at least a portion of the designated area may overlap the camera module 305 and/or the sensor module. As another example, some sensor modules may be arranged to perform their functions without being visually exposed through the front plate 302 from the internal space of the electronic device.

The electronic device 101 disclosed in FIGS. 2 and 3 has a bar-type or plate-type appearance but the disclosure is not limited thereto. For example, the illustrated electronic device may be part of a rollable electronic device or a foldable electronic device. "Rollable electronic device" may refer to an electronic device at least a portion of which may be wound or rolled or received in a housing (e.g., the housing 310 of FIG. 2) as the display (e.g., the display 330 of FIG. 4) may be bent and deformed. As the display is stretched out or is exposed to the outside in a larger area according to the user's need, the rollable electronic device may use an expanded second display area. "Foldable electronic device" may refer to an electronic device that may be folded in directions to face two different areas of the display or in directions opposite to each other. In general, in the portable state, the foldable electronic device may be folded so that the two different areas of the display face each other and, in an actual use state, the user may unfold the display so that the two different areas form a substantially flat shape. In some embodiments, according to various embodiments of the disclosure, the electronic device 101 may be interpreted as including various electronic devices, such as a laptop computer or a home appliance, as well as a portable electronic device, such as a smart phone.

Metal may be used as an exterior material of the electronic device. For example, a metal texture may be implemented on the exterior material of the electronic device by depositing a metal, such as indium, on the housing (e.g., rear cover) of the electronic device. In a state in which the housing (e.g., rear cover) is formed of glass, an optical clear adhesive (OCA) is provided on one surface of a poly ethylene terephthalate (PET) film, and a metal-texture decoration layer is formed on the other surface thereof using, e.g., an ultra violet (UV) molding pattern, indium deposition, and/or shield printing. The decoration layer is laminated on the inner surface of the glass, implementing a metal-texture glass.

Figure 4:
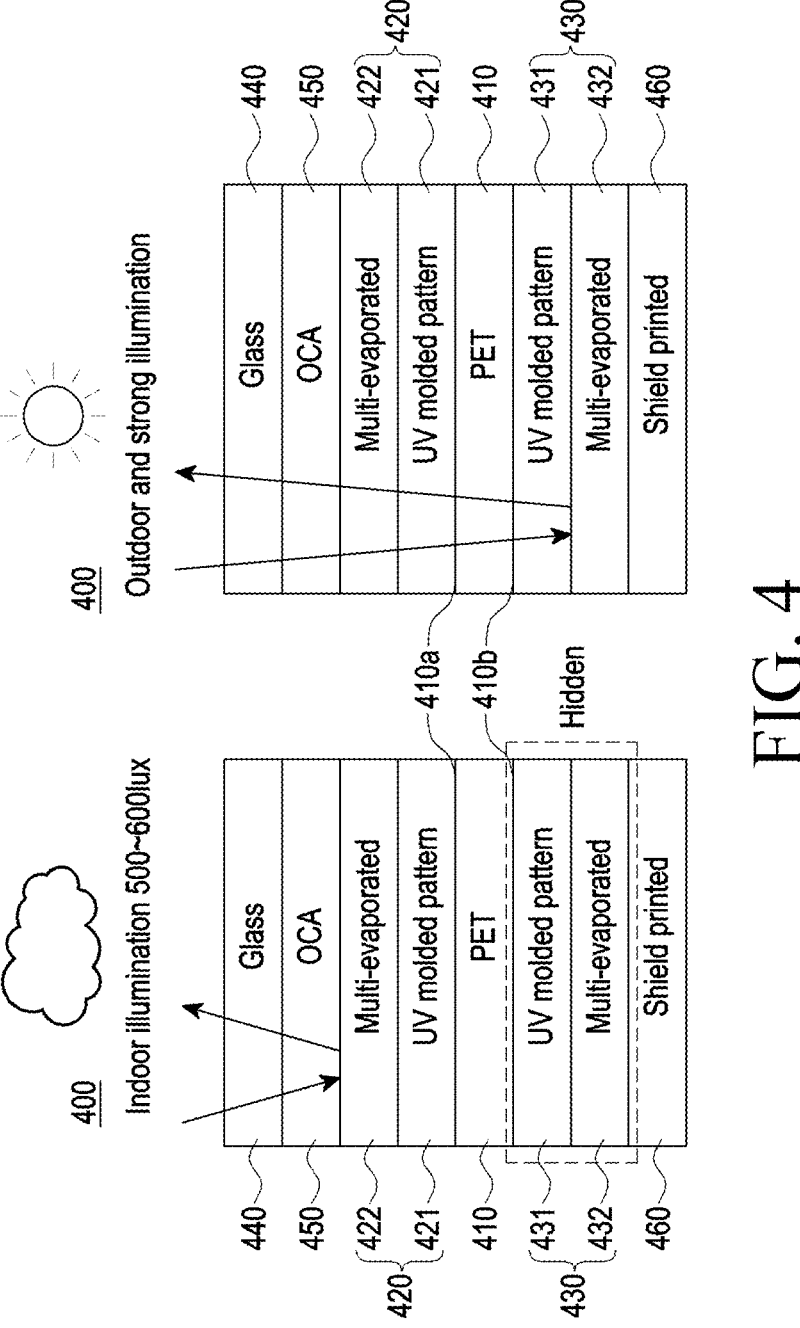
FIG. 4 is a diagram illustrating a housing of an electronic device according to an embodiment of the disclosure.
Figure 5:
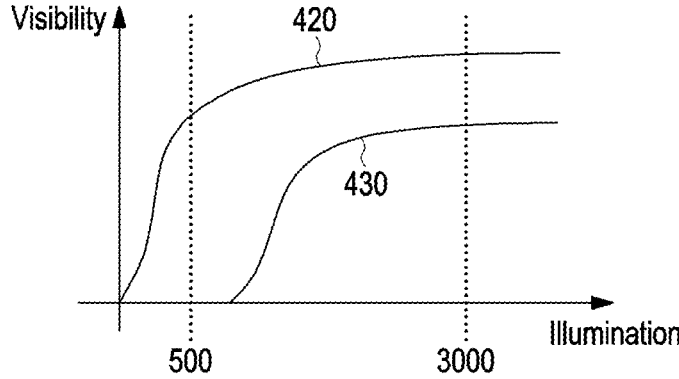
FIG. 5 is a graph illustrating ranges in which a first visible layer and a second visible layer are visible according to the illuminance, according to an embodiment of the disclosure.

FIG. 4 is a diagram illustrating a housing of an electronic device according to an embodiment of the disclosure. FIG. 5 is a graph illustrating ranges in which a first visible layer and a second visible layer are visible according to the illuminance, according to an embodiment of the disclosure;

An embodiment of the disclosure may include a housing 400 of an electronic device which implements a hidden effect of a pattern and/or color depending on the intensity of illumination. A housing 400 of the electronic device 101 is described herein. However, an embodiment of the disclosure may be directed to accessory covers of the electronic device 101 or decoration films attachable (or mountable) to the electronic device, rather than the housing 400 of the electronic device 101. The housing 400 of the electronic device 101, the accessory cover of the electronic device 101, or the decorative film may include substantially the same components. Accordingly, the description of the housing 400 of the electronic device 101 described below may be applied to the accessory cover or decoration film of the electronic device 101.

An electronic device (e.g., the electronic device 101 of FIG. 1) may include a housing 400 including a base layer 410, a first visible layer 420, and a second visible layer 430. The first visible layer 420 may be formed on a first surface 410a of the base layer 410. The second visible layer 430 may be formed on a second surface 410b of the base layer 410. According to an embodiment, the first visible layer 420, the base layer 410, and the second visible layer 430 may be components sequentially stacked from the outside to the inside of the housing 400. According to an embodiment, with respect to the base layer 410, the first visible layer 420 may be referred to as a layer disposed on the front surface of the base layer 410, and the second visible layer 430 may be referred to as a layer disposed on the rear surface of the base layer 410.

In an embodiment of the disclosure, the 'hidden effect' may be an effect according to whether the second visible layer 430 disposed further inside of the housing 400 than the first visible layer 420 is visible or non-visible from the outside. For example, when the first visible layer 420 includes a first pattern, and the second visible layer 430 includes a second pattern, the second visible layer 430 being visible may refer to the first pattern of the first visible layer 420 and the second pattern of the second visible layer 430 being seen as mixed or overlapped, rather than the first pattern of the first visible layer 420 being not seen while the second pattern of the second visible layer 430 being seen. In this case, the second visible layer 430 may be configured to be visible or non-visible depending on the illumination environment of the electronic device 101. For example, the second visible layer 430 may be configured to be non-visible to the outside of the electronic device 101 in a first illumination environment and be visible along with the first visible layer 420 in a second illumination environment.

The first illumination environment may refer to an outside/ambient environment of the electronic device 101. The housing 400 of the electronic device 101 may be designed considering the first illumination environment. For example, the first illumination environment may refer to an indoor illumination environment, such as a residential space or an office. For example, if the first illumination environment is numerically expressed, it may be an illumination environment of 600 Lux or less. The second illumination environment may also refer to the outside/ambient environment. The housing 400 of the electronic device 101 may be designed considering the second illumination environment. For example, the second illumination environment may be an outdoor illumination environment, such as a playground or a park. Further, the second illumination environment may be, e.g., an environment in which the electronic device is used outdoors and under strong sunlight. For example, if the second illumination environment is numerically expressed, it may be an illumination environment exceeding 600 Lux.

An example is described with reference to FIGS. 4 and 5. In an illumination environment near an indoor illumination of 500 Lux, the second visible layer 430 of the housing 400 of the electronic device is not visible to the outside and reveals the hidden effect, such that only the first visible layer 420 is visible to the outside. Further, both the first visible layer 420 and the second visible layer 430 may be seen in an environment of, e.g., 1000 Lux or higher (e.g., 3000 Lux). In this case, the second visible layer 430 of the housing 400 of the electronic device may be seen to the outside as mixed or overlapped with the first visible layer 420.

To implement the hidden effect, it may be necessary to apply a pattern layer and a color layer to each of the front and rear surfaces of the base layer 410 of the housing 400.

The base layer 410 may be formed of, e.g., polyethylene terephthalate (PET), but is not necessarily limited thereto. The base layer 410 may include a transparent material capable of transmitting light, such as polycarbonate, polysulfone, polyacrylate, polystyrene, polyvinylchloride, polyvinyl alcohol, polynorbornene, and/or polyester-based materials. Other materials, such as polyethylene naphthalate, may also be included. At least a portion of the base layer 410 may include an electrically conductive material. For example, the base layer 410 may be composed of a metallic (e.g., aluminum) frame.

The first visible layer 420 may include a first pattern layer 421 with the first pattern and a first color layer 422 with a first color. Here, the first pattern layer 421 is a pattern layer formed on the first surface 410a of the base layer 410, and may be a pattern molded on one surface of the base layer 410 according to a UV curing method, that is, a UV-molded pattern. The first color layer 422 is a layer formed on one surface of the first pattern layer 421 and may be, e.g., a color evaporated layer colored by an evaporation technique. The first color layer 422 may include a first color. The first color may include a combination of one or more colors. In other words, the first color layer 422 may include a plurality of colors. In this case, the first color layer 422 may be formed by a multi-evaporation technique. For reference, FIG. 4 and its subsequent figures illustrate the type of each layer, as the component of the housing 400, along with the technique for forming each layer. This is for convenience of description, and it should be noted that the scope of the disclosure is not limited thereto. For example, the scope of the disclosure is not limited to the type of each layer or the technique for forming each layer shown in FIG. 4.

Figure 6A:
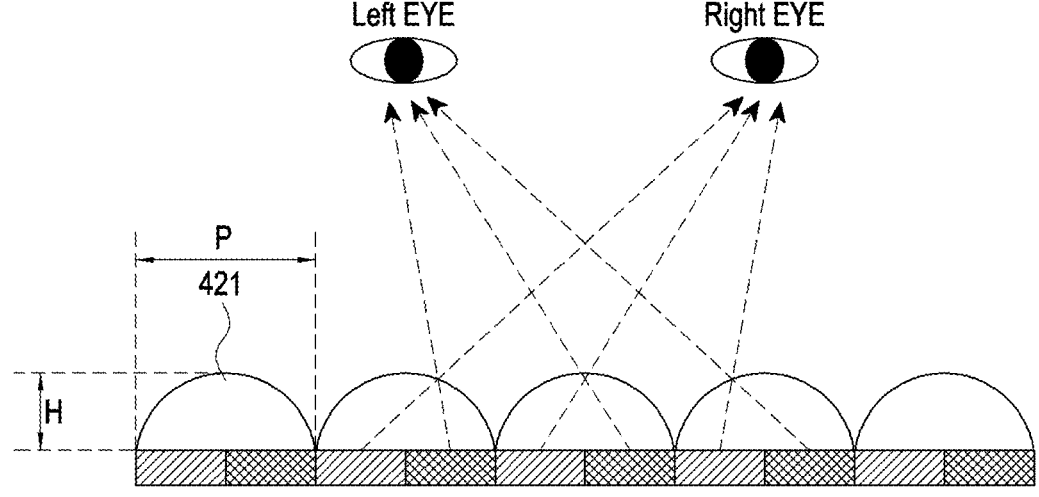
FIGS. 6A and 6B are diagrams of a first pattern layer, according to an embodiment of the disclosure.
Figure 6B:
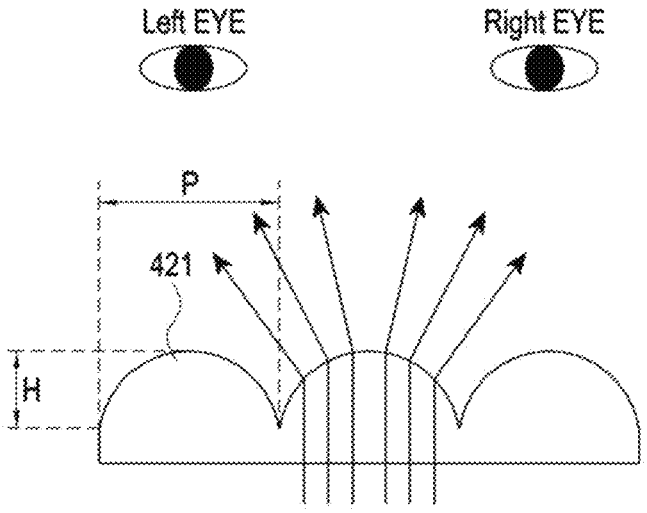

FIGS. 6A and 6B are diagrams of a first pattern layer 421, according to an embodiment of the disclosure. FIGS. 6A and 6B may show a state when the first pattern layer 421 is viewed through both eyes (left and right eyes) of the user.

The first pattern of the first pattern layer 421 may be a lenticular pattern. According to an embodiment, the cross section of the first pattern of the first pattern layer 421 may correspond to a lenticular pattern having a semi-cylindrical shape. According to an embodiment, the lenticular pattern may be formed to have a height H of about 7 to 12 μm. According to another embodiment, the lenticular pattern may be formed to have a pitch P of about 60 to 90 μm. The lenticular pattern, as the pattern of the first pattern layer 421 positioned on the first surface 410a of the base layer 410 to exhibit light reflection and refraction may be advantageous over prisms or pattern structures having an asymmetrical cross section. For example, when a prism is formed as the pattern of the first pattern layer 421, the hidden effect may be reduced due to the corner of the edge. In contrast, the lenticular pattern may provide a three-dimensional effect when light passes through the lenticular pattern due to a difference in vision between the left and right eyes as shown in FIG. 6A. Further, as shown in FIG. 6B, as the cross section is formed in a semi-cylindrical shape, refraction and reflection of light passing through the lenticular pattern may have a constant directivity, allowing for even visibility of the first visible layer 420.

Figure 7:
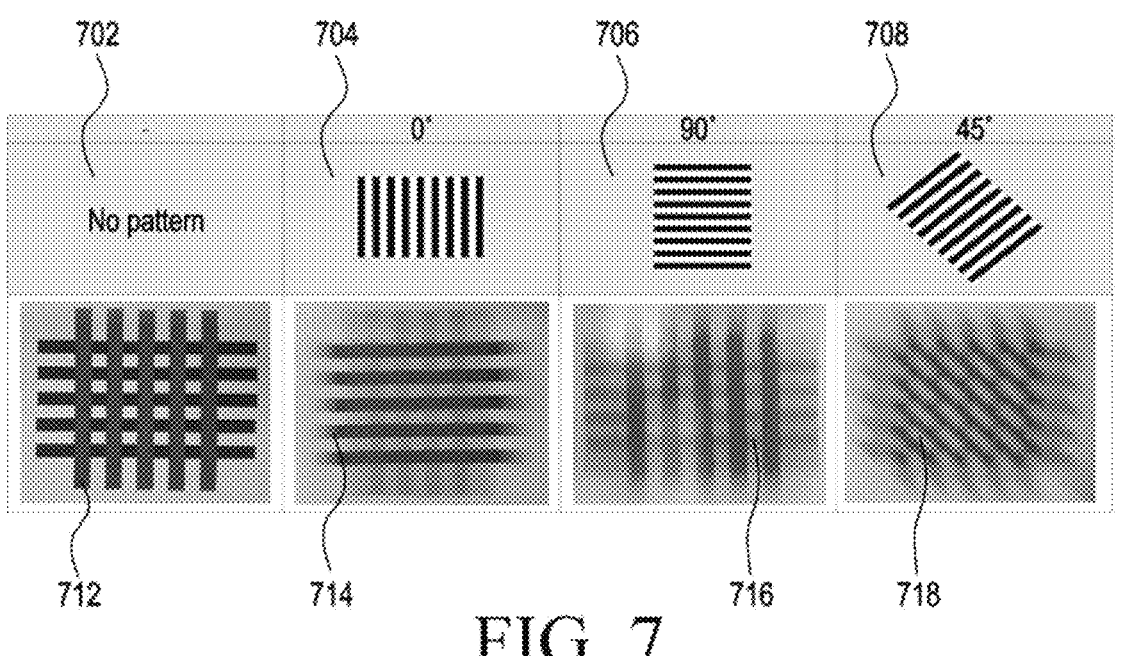
FIG. 7 is a diagram illustrating a general effect of a lenticular pattern according to an embodiment of the disclosure.

FIG. 7 is a diagram illustrating a general effect of a lenticular pattern according to an embodiment of the disclosure. FIG. 7 is a view illustrating how another pattern provided on the rear surface of the lenticular pattern is viewed when there is no restriction due to the lenticular pattern and when there is a restriction due to the lenticular pattern.

For example, when there is no restriction due to the lenticular pattern (no pattern in 702), the other pattern 712 provided on the rear surface of the lenticular pattern may be clearly recognized. As another example, if there is a restriction due to the lenticular pattern (e.g., patterns 704, 706 and 708), light may be refracted or scattered while passing through the lenticular pattern, causing the other pattern (e.g., patterns 714, 716 and 718 respectively) provided on the rear surface not to be clearly seen. For example, when the lenticular pattern is disposed at 0 degrees (704), 90 degrees (706), and 45 degrees (708), the visibility of the other pattern (714, 716 and 718 respectively) seen on the rear surface of the lenticular pattern may be lowered. The other patterns (712, 714, 716 and 718) provided on the rear surface of the lenticular pattern is shown in FIG. 7 as a thick line for a better understanding, but is not limited thereto. When a fine pattern is formed as the other pattern provided on the rear surface of the lenticular pattern, visibility may be further lowered.

Figure 8A:
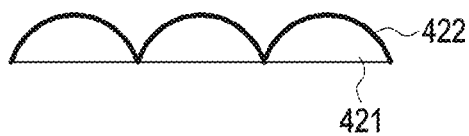
FIGS. 8A and 8B are diagrams illustrating a state in which a first color layer is evaporated on a first pattern layer including a lenticular pattern, according to an embodiment of the disclosure.
Figure 8B:
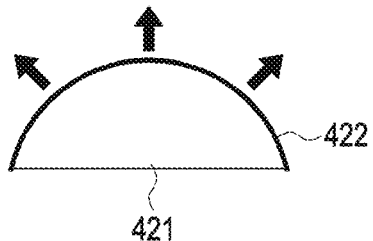

FIGS. 8A and 8B are diagrams illustrating a state in which a first color layer 422 is evaporated on a first pattern layer 421 including a lenticular pattern, according to an embodiment of the disclosure.

The lenticular pattern may have a light refraction and reflection effect along with the visual effect of representing each image in three dimensions (3D). In an embodiment of the disclosure, the first pattern layer 421 having a lenticular pattern is included, implementing a hidden effect using the light refraction and reflection effect.

Further, evaporating and forming a first color layer 422 on the first pattern layer 421 may increase the reflection effect, implementing the hidden effect more easily and effectively.

For example, it may be difficult to implement the hidden effect only with the shape of the lenticular pattern formed on the first pattern layer 421 at an indoor illumination level of 600 Lux or less. Thus, according to the embodiment of the disclosure, the light reflection effect may be increased by additionally forming the first color layer 422 having a predetermined reflectance on the surface of the first pattern layer 421. According to an embodiment, the first color layer 422 may be formed of a layer having a reflectance of about 40 to 50%. According to an embodiment, the first color layer 422 may include TiO2 and SiO2. The reflectance of about 40 to 50% may be determined by a combination of TiO2 and SiO2. For example, the first color layer 422 may include at least one TiO2 layer and at least one SiO2 layer. According to an embodiment, a multi-evaporation technique may be used to deposit SiO2 after depositing TiO2 on the first color layer 422. As the plurality of TiO2 layers and the plurality of SiO2 layers are alternately disposed, the first color layer 422 may be formed of a layer having a reflectance of about 40 to 50% using a difference in refractive index between the different material layers. For example, the first color layer 422 may have a stacked structure in which TiO2 is formed in the first layer, SiO2 is formed in the second layer, TiO2 is formed in the third layer, and SiO2 is formed in the fourth layer. In this case, if the reflectance of the first color layer 422 is 40% or less, the pattern and color of the second visible layer 430 may be seen as minute from the outside and, if the reflectance is 50% or more, strong light energy is required to make the pattern and color of the second visible layer 430 visible, so that it may be hard to reveal the hidden effect at an average indoor illumination level.

Embodiments of the disclosure may implement the hidden effect of the second visible layer 430 formed on the rear surface of the base layer 410 by the reflectance of the first color layer 422 along with the shape of the first pattern layer 421 (e.g., lenticular pattern).

Referring back to FIG. 4, the second visible layer 430 may include a second pattern layer 431 having a second pattern and a second color layer 432 having a second color. The second pattern layer 431 is a pattern layer formed on the second surface 410b of the base layer 410, and may be a pattern molded on one surface of the base layer 410 according to a UV curing method, that is, a UV-molded pattern. The second color layer 432 is a layer formed on one surface of the second pattern layer 431 and may be, e.g., a color evaporated layer colored by an evaporation technique. The second color layer 432 may include a second color. The second color may include a combination of one or more colors. The second color layer 432 may include a plurality of colors like the first color layer 422. In this case, the second color layer 432 may be formed by a multi-evaporation technique.

According to an embodiment, the second color layer 432 may be formed to have a reflectance of about 30 to 45%. For example, when formed to have an about 5 to 10% lower reflectance than the first color layer 422, the second color layer 432 may enhance the visibility of the second pattern layer 431 of the second visible layer 430. According to an embodiment, the second pattern layer 431 may be a macro pattern having a random shape. Forming the second pattern layer 431 to have the macro pattern allows the overall visibility to be blurred in random directions, rather than a specific direction, as compared with the first pattern layer 421 formed with a lenticular pattern. According to an embodiment, the second color layer 432 may include TiO2 and SiO2. The reflectance of about 30 to 45% may be determined by a combination of TiO2 and SiO2. For example, the second color layer 432 may include at least one TiO2 layer and at least one SiO2 layer. According to an embodiment, a multi-evaporation technique may be used to deposit SiO2 after depositing TiO2 on the second color layer 432. As the plurality of TiO2 layers and the plurality of SiO2 layers are alternately disposed, the second color layer 432 may be formed of a layer having a reflectance of about 30 to 45% using a difference in refractive index between the different material layers.

Figure 9:
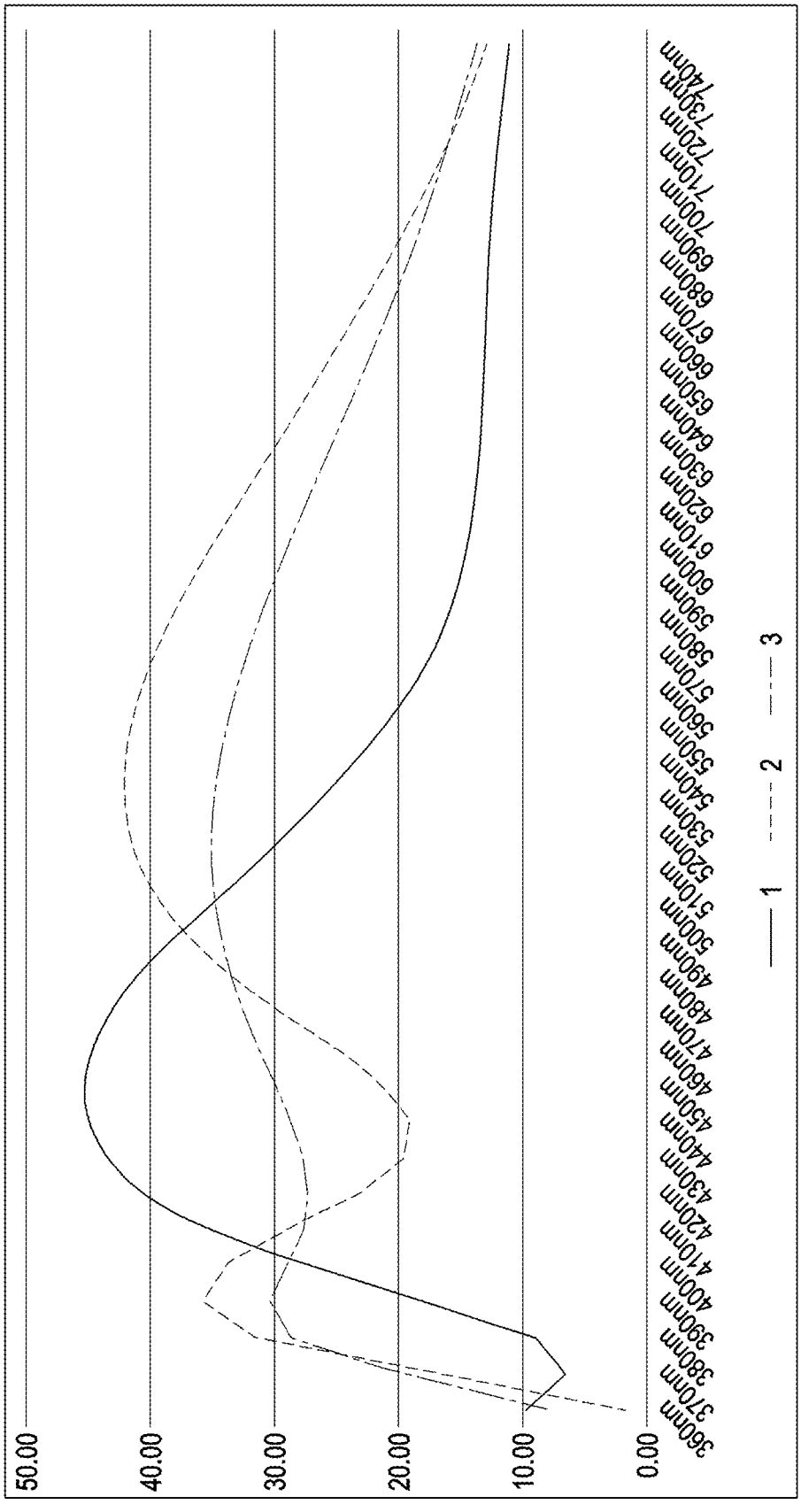
FIG. 9 is a graph in which reflectance for each wavelength band of a housing is measured according to an embodiment of the disclosure.

FIG. 9 is a graph in which reflectance for each wavelength band of a housing is measured according to an embodiment of the disclosure.

FIG. 9 shows the results of an experiment performed on three samples having different wavelength bands of the color evaporated layer (first color layer) on the front surface and the color evaporated layer (second color layer) on the rear surface in the same illumination environment while changing the structure conditions of the lenticular pattern and the reflection conditions of the color evaporated layer (first color layer) on the front surface.

Referring to FIG. 9, embodiment 1 (solid line) may show a housing including the first color layer 422 having a reflectance of about 40 to 50% in a visible light wavelength band of about 420 nm to 480 nm. Embodiment 1 (solid line) may show a sample that implements the hidden effect that the color of the first color layer 422 having a reflectance of about 40 to 50% is seen, but the rear surface is not seen in the wavelength band (420 nm to 480 nm) where the color of the color evaporated layer on the front surface is seen. Embodiment 1 may show a state when the height of the lenticular pattern is about 7 to 12 μm, the pitch is about 60 to 90 μm, and the reflectance of the first color layer 422 is about 40 to 50%.

Embodiment 2 (dashed line) regards a sample different in the height and pitch of the lenticular pattern from embodiment 1 (solid line), showing a mixed color of the color evaporated layer (first color layer) on the front surface and the color evaporated layer (second color layer) on the rear surface and resultant wavelength band (reflectance of about 40 to 50% in the wavelength band of about 510 nm to 550 nm). Embodiment 2 may show the mixed color of the front surface color evaporation and the rear surface color evaporation and the wavelength band in a structure where the lenticular pattern is out of the depth or pitch. Embodiment 3 regards a sample when the color evaporated layer (first color layer) on the front surface has a reflectance lower than the reflectance of about 40 to 50%, showing the mixed color of the color evaporated layer (first color layer) on the front surface and the color evaporated layer (second color layer) on the rear surface and the wavelength band.

Figure 10:
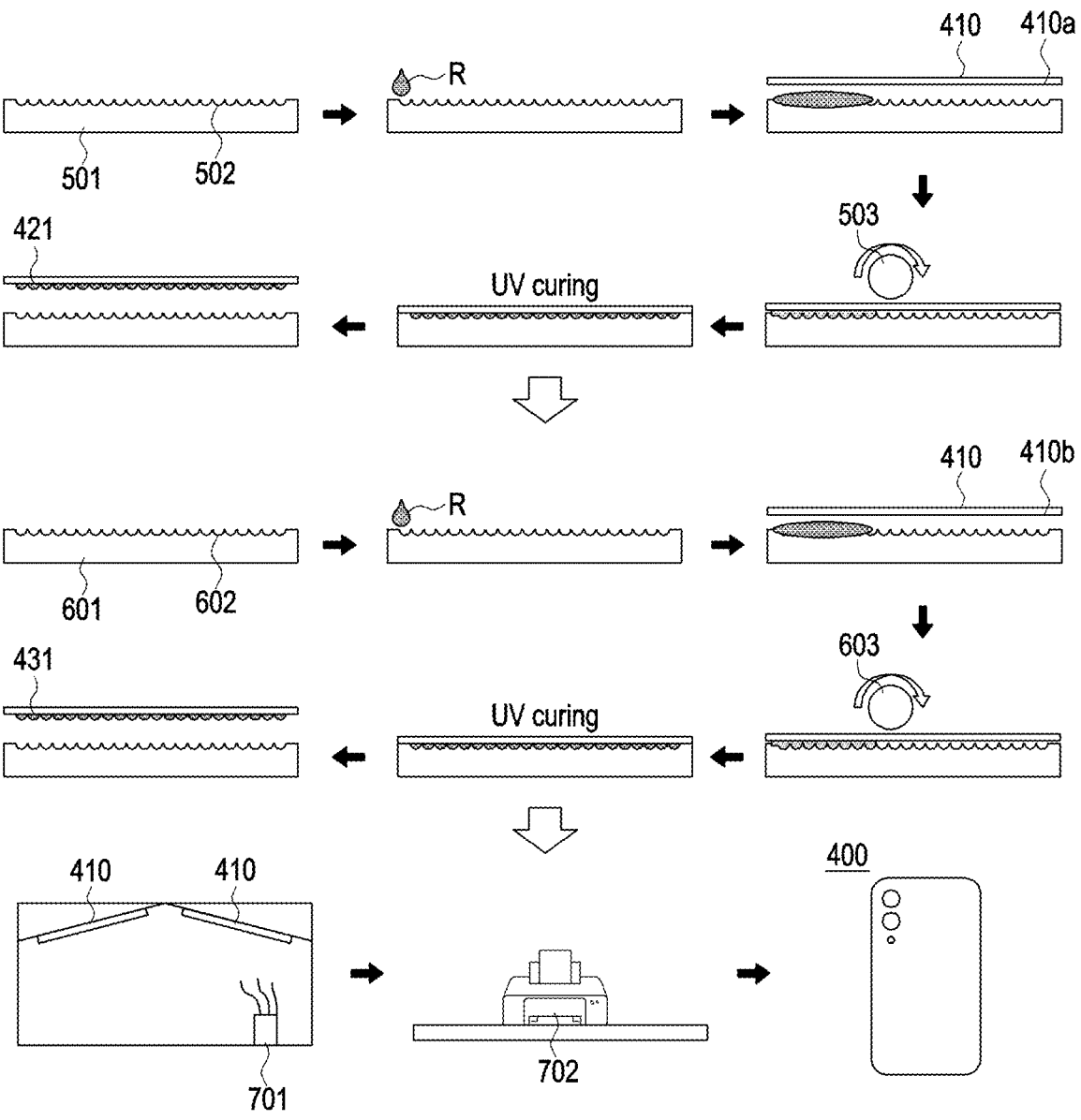
FIG. 10 is a diagram illustrating a method for manufacturing a housing of an electronic device according to an embodiment of the disclosure.

FIG. 10 is a diagram illustrating a method for manufacturing a housing of an electronic device according to an embodiment.

First, the shape and outer appearance of the electronic device are designed. The design and the number of colors for implementing the outer appearance, a color layout, and the pattern to be seen may be determined. A base layer 410 for forming the pattern and color is prepared.

A first mold 501 having a first pattern 502 may be prepared to pattern the first surface 410a of the base layer 410. A UV curable resin R may be injected into the prepared first mold 501. The resin injected in a predetermined amount into the first mold 501 may be spread on the first pattern 502 of the first mold 501 while the base layer 410 is seated thereon. The resin compressed by the first surface 410a of the base layer 410 and spread on the first mold 501 may be further compressed by a roller 503 moving on the base layer 410 to permeate into the in-betweens of the first pattern 502 of the first mold 501. Further, the resin cured through the UV curing process may be attached to the first surface 410a of the base layer 410. A first pattern layer 421 may be formed on the first surface 410a of the base layer 410 through this process.

A second mold 601 having a second pattern 602 may be prepared to pattern the second surface 410*b* of the base layer 410. A UV curable resin R may be injected into the prepared second mold 601. The resin injected in a predetermined amount into the second mold 601 may be spread on the second pattern 602 of the second mold 601 while the base layer 410 is seated thereon. The resin compressed by the second surface 410*b* of the base layer 410 and spread on the second mold 601 may be further compressed by a roller 603 moving on the base layer 410 to permeate into the in-betweens of the second pattern 602 of the second mold 601. Further, the resin cured through the UV curing process may be attached to the second surface 410*b* of the base layer 410. A second pattern layer 431 may be formed on the second surface 410*b* of the base layer 410 through this process.

The first pattern layer 421 formed on the first surface 410*a* of the base layer 410 and the second pattern layer 431 formed on the second surface 410*b* of the base layer 410 may be formed in any order. According to an embodiment, the first pattern layer 421 may be first formed on the base layer 410 and then the second pattern layer 431 may be formed. In contrast, the second pattern layer 431 may be first formed, and then the first pattern layer 421 may be formed. Alternatively, after forming the first pattern layer 421 on the base layer 410 and forming the second pattern layer 431 on another base layer 410, the two base layers 410 may be laminated, with the non-patterned surfaces of the two base layers 410 brought to face each other.

A housing 400 (accessory cover or decoration film) may be manufactured in which a first color layer 422 and/or a second color layer 432 is formed on the surface of the first pattern layer 421 and/or the second pattern layer 431 through an evaporation process in the base layer 410 having the first pattern layer 421 and/or the second pattern layer 431. The color layer may be formed by exposing the base layer 410 having the first pattern layer 421 and/or the second pattern layer 431 to an evaporator 701. The first color layer 422 and/or the second color layer 432 may include at least one color. Depending on the embodiment, it may be formed as a multi-color layer having a plurality of colors. The housing 400 may be formed to have a desired size and shape via an additional process (e.g., a forming or printing process using a forming machine (e.g., mold 702) on the base layer 410 having the first pattern layer 421 and/or the second pattern layer 431 and the first color layer 422 and/or the second color layer 432.

Referring back to FIG. 4, the housing 400 of the electronic device 101 may further include glass 440 (e.g., a glass layer) and an adhesive layer 450.

The glass 440 may be formed on one surface of the first visible layer 420 and may form the outermost material of the housing 400. The adhesive layer 450 may be formed on the rear surface of the glass 440 to maintain adhesion with the first visible layer 420.

The housing 400 of the electronic device 101 may further include a shield printed layer 460. The shield printed layer 460 may be formed of an opaque material and may be disposed on the rear surface of the second visible layer 430 to prevent internal components of the electronic device 101 from being visible to the outside.

Figure 11A:
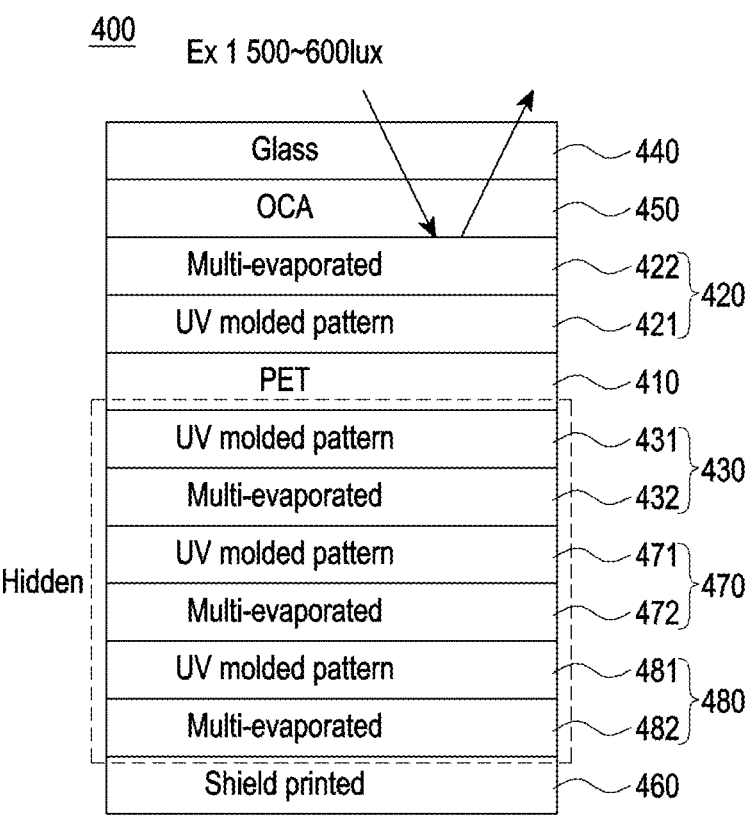
FIGS. 11A, 11B and 11C are diagrams illustrating a housing of an electronic device according to an embodiment of the disclosure.
Figure 11B:
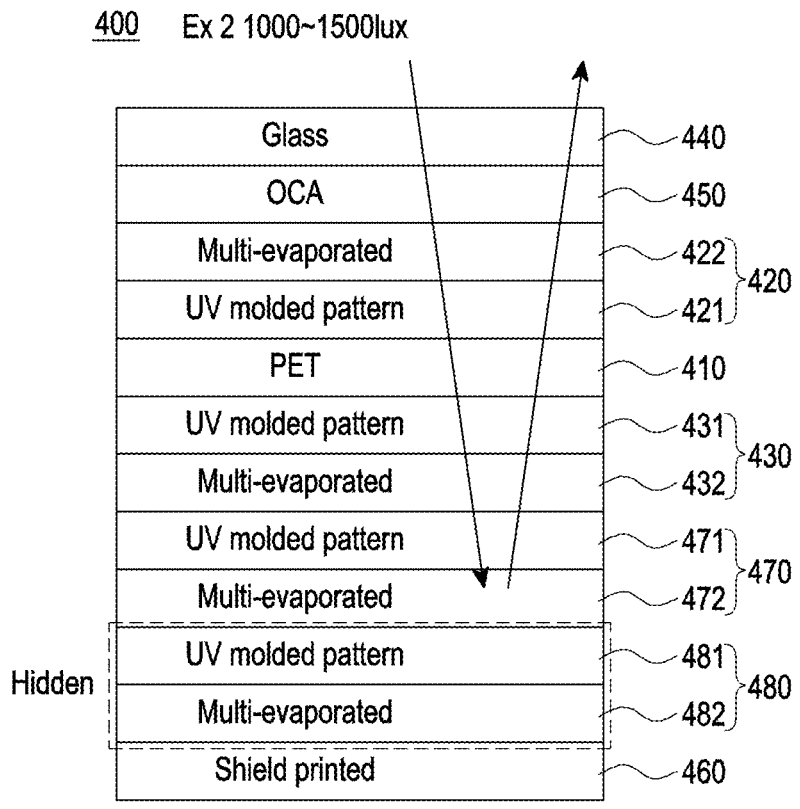
Figure 11C:
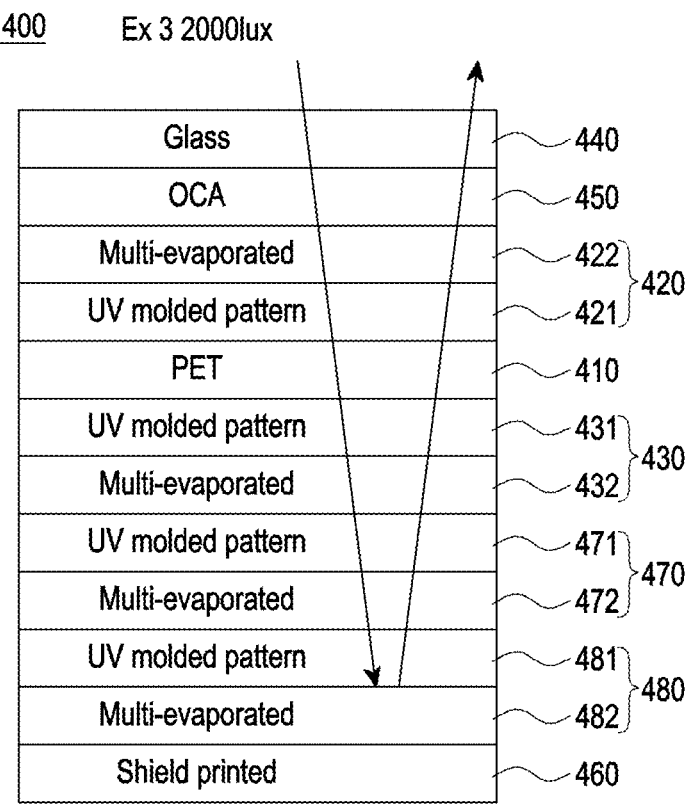

FIGS. 11A, 11B and 11C are diagrams illustrating a housing of an electronic device according to an embodiment of the disclosure. FIG. 11A may illustrate light being incident on the housing 400 and then refracted and/or reflected in a first illumination environment of 500 to 600 lux, as an embodiment. FIG. 11B may illustrate light being incident on the housing 400 and then refracted and/or reflected in a second illumination environment of 1000 to 1500 lux, as an embodiment. FIG. 11C may illustrate light being incident on the housing 400 and then refracted and/or reflected in a third illumination environment of 2000 lux or more, as an embodiment.

Referring to FIGS. 11A to 11C, an electronic device (e.g., the electronic device 101 of FIG. 1) may include a housing 400 including a base layer 410, a first visible layer 420, and a second visible layer 430. The first visible layer 420 may be formed on one surface (e.g., the first surface 410*a* of FIG. 4) of the base layer 410. The second visible layer 430 may be formed on the other surface (e.g., the second surface 410*b* of FIG. 4) of the base layer 410.

The first visible layer 420 may include a first pattern layer 421 with the first pattern and a first color layer 422 with a first color. The first pattern layer 421 is a pattern layer formed on the first surface 410*a* of the base layer 410 and may be a UV molded pattern. The first pattern of the first pattern layer 421 may be a lenticular pattern. According to an embodiment, the cross section of the first pattern of the first pattern layer 421 may correspond to a lenticular pattern having a semi-cylindrical shape. The first color layer 422 is a layer formed on one surface of the first pattern layer 421 and may be, e.g., a color evaporated layer colored by an evaporation technique.

The second visible layer 430 may include a second pattern layer 431 with the second pattern and a second color layer 432 with a second color. The second pattern layer 431 is a pattern layer formed on the second surface 410*b* of the base layer 410 and may be a UV molded pattern. The second pattern of the second pattern layer 431 may be a macro pattern. The second color layer 432 is a layer formed on one surface of the second pattern layer 431 and may be, e.g., a color evaporated layer colored by an evaporation technique.

The embodiments of FIGS. 11A to 11C may further include a third visible layer 470. The third visible layer 470 may include a third pattern layer 471 with a third pattern and a third color layer 472 with a third color. The third color layer 472 may include a third color. The third color may include a combination of one or more colors.

According to an embodiment, the housing 400 may further include a fourth visible layer 480 formed on a rear surface of the third visible layer 470. The fourth visible layer 480 may include a fourth pattern layer 481 with a fourth pattern and a fourth color layer 482 with a fourth color. The fourth color layer 482 may include a fourth color. The fourth color may include a combination of one or more colors.

The third pattern of the third visible layer 470 may be formed as a lenticular pattern, and the fourth pattern of the fourth visible layer 480 may be formed as a macro pattern. In other words, the combination of the lenticular pattern and the macro pattern of the first visible layer 420 and the second visible layer 430 may be repeated in the third visible layer 470 and the fourth visible layer on the rear surface of the second visible layer 430. Such a repeated pattern structure allows for a more in-depth pattern hiding and/or visible structure.

In the embodiment of FIG. 11A, a hiding operation in which the second visible layer 430, the third visible layer 470, and the fourth visible layer 480 are hidden by the first visible layer 420 may be implemented. The hiding operation in which the second visible layer 430, the third visible layer 470, and the fourth visible layer 480 are hidden may be implemented in a first illumination environment (e.g., 600 lux or less, more specifically, 500 to 600 lux).

In the embodiment of FIG. 11B, the light passing through the first visible layer 420 and the second visible layer 430 may be blocked by the third visible layer 470. In other words, a hiding operation in which the fourth visible layer 480 is hidden by the third visible layer 470 may be implemented. The hiding operation in which the fourth visible layer 480 is hidden may be implemented in a second illumination environment (e.g., 1000 to 1500 lux).

In the embodiment of FIG. 11C, the light incident on the housing 400 may pass through the first visible layer 420, the second visible layer 430, the third visible layer 470, and the fourth visible layer 480, and then be reflected and/or refracted. In the embodiment of FIG. 11C, the first to fourth patterns of the first visible layer 420, the second visible layer 430, the third visible layer 470, and the fourth visible layer 480 may be seen as mixed or overlapped. The operation in which the first to fourth patterns of the first visible layer 420, the second visible layer 430, the third visible layer 470, and the fourth visible layer 480 are seen as mixed or overlapped may be implemented in the third illumination environment (e.g., 2000 lux).

According to various embodiments of the disclosure described above, there may be provided a housing (or accessory cover or decoration film) in which combinations of various patterns and colors are seen to the user's naked eye as changed in various manners depending on illumination environments.

The electronic device according to an embodiment of the disclosure may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

According to an embodiment, each component (e.g., a module or a program) of the above-described components may include a single entity or multiple entities. Some of the plurality of entities may be separately disposed in different components. According to an embodiment, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to an embodiment, operations performed by the module, the program, or another component may be carried out sequentially, in parallel, repeatedly, or heuristically, or one or more of the operations may be executed in a different order or omitted, or one or more other operations may be added.

According to an embodiment of the disclosure, there may be provided a housing 400 of an electronic device 101. A housing 400 of an electronic device may include a base layer 410, a first visible layer 420 formed on a first surface 410*a* of the base layer 410, and a second visible layer 430 formed on a second surface 410*b* of the base layer 410. The second visible layer 430 may be configured to be non-visible from the outside of the electronic device 101 in a first illumination environment and be visible from the outside of the electronic device, together with the first visible layer 420, in a second illumination environment.

According to an embodiment, the first illumination environment may have an illumination value of about 600 lux or less, and the second illumination environment may have an illumination value exceeding about 600 lux.

The first visible layer 420 may include a first pattern layer 421 having a first pattern and a first color layer 422 having a first color.

According to an embodiment, the first pattern layer may have a lenticular pattern.

According to an embodiment, the lenticular pattern may be formed to have a height of 7 μm to 12 μm.

According to an embodiment, the lenticular pattern may be formed to have a pitch of 60 μm to 90 μm.

According to an embodiment, the first color layer may be formed to have a reflectance of 40% to 50%.

According to an embodiment, the first color layer 422 may be formed of a combination of TiO2 and SiO2.

According to an embodiment, the first color may be formed of a combination of a plurality of colors.

According to an embodiment, the second visible layer 430 may include a second pattern layer 431 having a second pattern and a second color layer 432 having a second color.

According to an embodiment, the second color layer 432 may be formed to have a reflectance of 30% to 45%.

According to an embodiment, the housing may further include a glass 440 and an adhesive layer 450 on one surface of the first visible layer 420.

According to an embodiment, the housing may further include at least one third visible layer 470 different from the first visible layer 420 and the second visible layer 430.

According to an embodiment, the at least one third visible layer 470 may be formed on one surface of the second visible layer 430.

According to an embodiment, the second visible layer may be configured so that the third visible layer is non-visible from the outside of the electronic device in the first illumination environment and the second illumination environment, but is visible from the outside of the electronic device in a third illumination environment.

According to various embodiments of the disclosure, there may be provided a housing of an electronic device. A housing or housing cover of an electronic device may include a base layer 410, a first pattern layer 421 formed on a first surface 410a of the first base layer 410, a first color layer 422 formed on one surface of the first pattern layer 421, a second pattern layer 431 formed on a second surface 410b of the base layer 410, and a second color layer 432 formed on one surface of the second pattern layer 431. The first pattern layer 421 may be formed as a lenticular pattern. The second pattern layer 431 may be formed as a macro pattern. The second color layer 432 may be configured to be non-visible from an outside electronic device in a first illumination environment and to be, along with the first color layer 422, visible from the outside of the electronic device in a second illumination environment.

According to an embodiment, the first illumination environment may have an illumination value of about 600 lux or less, and the second illumination environment may have an illumination value exceeding about 600 lux.

According to an embodiment, the housing may further include at least one third visible layer 470 different from the first visible layer 420 and the second visible layer 430.

The third visible layer 470 may be formed on one surface of the second visible layer 430.

According to an embodiment of the disclosure, there may be provided a housing 400 of an electronic device 101. A housing 400 may include a base layer 410, a first visible layer 420 formed on a first surface 410a of the base layer 410, and a second visible layer 430 formed on a second surface 410b of the base layer 410. The first visible layer 420 may be configured so that the second visible layer 430 is non-visible from an outside of the electronic device 101 in a first illumination environment and is visible from the outside of the electronic device in a second illumination environment.

According to an embodiment, the first illumination environment may have an illumination value of about 600 lux or less, and the second illumination environment may have an illumination value exceeding about 600 lux.

It is apparent to one of ordinary skill in the art that the electronic device and method for manufacturing the housing of the electronic device according to various embodiments of the disclosure as described above are not limited to the above-described embodiments and those shown in the drawings, and various changes, modifications, or alterations may be made thereto without departing from the scope of the disclosure. In various embodiments as described above, the housing of the electronic device may be replaced with an accessory cover or a decoration film.

Accordingly, the scope of various embodiments of the disclosure should be interpreted as encompassing all modifications or variations derived based on the technical spirit of various embodiments of the disclosure in addition to the embodiments disclosed herein.

What is claimed is:

1. A housing of an electronic device, the housing comprising:
a base layer;
a first visible layer provided on a first surface of the base layer; and a second visible layer provided on a second surface of the base layer,
wherein the second visible layer is non-visible from an outside of the electronic device in a first illumination environment, and
wherein the first visible layer and the second visible layer are visible from the outside of the electronic device in a second illumination environment.

2. The housing of claim 1, wherein the first illumination environment has an illumination value of about 600 lux or less, and
wherein the second illumination environment has an illumination value greater than about 600 lux.

3. The housing of claim 1, wherein the first visible layer comprises:
a first pattern layer having a first pattern, and
a first color layer having a first color.

4. The housing of claim 3, wherein the first pattern of the first pattern layer is a lenticular pattern.

5. The housing of claim 4, wherein the lenticular pattern has a height of 7 μm to 12 μm.

6. The housing of claim 5, wherein the lenticular pattern has a pitch of 60 μm to 90 μm.

7. The housing of claim 4, wherein the first color layer has a reflectance of 40% to 50%.

8. The housing of claim 4, wherein the first color layer comprises a combination of $TiO_2$ and $SiO_2$.

9. The housing of claim 4, wherein the first color layer comprises a combination of a plurality of colors.

10. The housing of claim 4, wherein the second visible layer comprises:
a second pattern layer having a second pattern, and
a second color layer having a second color.

11. The housing of claim 10, wherein the second color layer has a reflectance of 30% to 45%.

12. The housing of claim 1, further comprising:
an adhesive layer provided on a surface of the first visible layer; and
glass provided on the adhesive layer.

13. The housing of claim 1, further comprising at least one third visible layer different from the first visible layer and the second visible layer.

14. The housing of claim 13, wherein the at least one third visible layer is provided on a surface of the second visible layer.

15. The housing of claim 14, wherein the at least one third layer is non-visible from the outside of the electronic device in the first illumination environment and the second illumination environment, and
wherein the at least one third visible layer is visible from the outside of the electronic device in a third illumination environment.

16. A housing of an electronic device, the housing comprising:
a base layer;
a first pattern layer provided on a first surface of the base layer;
a first color layer provided on a surface of the first pattern layer;
a second pattern layer provided on a second surface of the base layer; and
a second color layer provided on a surface of the second pattern layer,
wherein the first pattern layer has a lenticular pattern,
wherein the second pattern layer has a macro pattern, wherein the second color layer is non-visible from an outside of the electronic device in a first illumination environment, and wherein the first color layer and the second color layer are visible from the outside of the electronic device in a second illumination environment.

17. The housing of claim 16, wherein the first illumination environment has an illumination value of about 600 lux or less, and wherein the second illumination environment has an illumination value greater than about 600 lux.

18. The housing of claim 16, further comprising:

at least one third layer provided on a surface of the second color layer, and different from the first color layer and the second color layer.

19. A film of an electronic device, the film comprising:

a base layer;

a first layer provided on a first surface of the base layer; and a second layer provided on a second surface of the base layer, wherein the first layer is configured such that the second layer is non-visible from an outside of the electronic device in a first illumination environment and the second visible layer is visible from the outside of the electronic device in a second illumination environment.

20. The film of claim 19, wherein the first illumination environment has an illumination value of about 600 lux or less, and wherein the second illumination environment has an illumination value greater than about 600 lux.

\* \* \* \* \*